United States Patent
Wang et al.

(10) Patent No.: US 6,680,657 B2
(45) Date of Patent: Jan. 20, 2004

(54) CROSS-COUPLED VOLTAGE CONTROLLED OSCILLATOR WITH IMPROVED PHASE NOISE PERFORMANCE

(75) Inventors: Xudong Wang, Groton, MA (US); Xiaodong Wang, Acton, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/162,579

(22) Filed: Jun. 6, 2002

(65) Prior Publication Data

US 2003/0227336 A1 Dec. 11, 2003

(51) Int. Cl.[7] .................................................. H03B 1/00
(52) U.S. Cl. .................................................. 331/177 V
(58) Field of Search ........................... 331/100, 117 R, 331/117 FE, 117 D, 167, 177 R, 177 V

(56) References Cited

U.S. PATENT DOCUMENTS

| | | | | |
|---|---|---|---|---|
| 6,064,277 A | * | 5/2000 | Gilbert | 331/117 R |
| 6,150,881 A | * | 11/2000 | Lovelace et al. | 330/252 |
| 6,229,406 B1 | * | 5/2001 | Wang | 331/117 FE |
| 6,268,778 B1 | * | 7/2001 | Mucke et al. | 331/117 R |
| 6,411,170 B2 | * | 6/2002 | Hino | 331/117 R |
| 6,545,555 B1 | * | 4/2003 | Justice et al. | 331/117 R |

OTHER PUBLICATIONS

A Filtering Technique to Lower LC Oscillator Phase Noise, IEEE Journal of Solid–State Circuits, Emad Hegazi et al. vol. 36, No. 12, Dec. 2001 pp. 1921–1930.

Tail Current Noise Suppression in RF CMOS VCOs, IEEE Journal of Solid–State Circuits, Pietro Andreani et al. vol. 37, No. 3, Mar. 2002, pp. 342–348.

A Low Phase Noise Monolithic VCO in SiGe BiCMOS, IEEE Radio Frequency Integrated Circuits Symposium, Jean–Marc Mourant et al. 2000, pp. 65–68.

* cited by examiner

Primary Examiner—Timothy P. Callahan
Assistant Examiner—Cassandra Cox
(74) Attorney, Agent, or Firm—Connolly Bove Lodge & Hutz, LLP; Joseph P. Abate

(57) ABSTRACT

A cross-coupled voltage controlled oscillator having reduced phase noise. A pair of bipolar transistors having common emitter connections are coupled to reduce that oscillation frequency which is determined from a tuning circuit connected across the collectors of transistors. First and second varactor diodes provide analog tuning of the circuit, and a digitally controlled capacitor provides for a selection of a band of frequencies to be tuned by the varactor diodes. A current source provides the current to the emitter connections of the bipolar transistors. Second harmonic signals generated at the emitter of the transistors are significantly suppressed by a tuned filtered trap connected to the common emitter connections. By reducing the second harmonic signals, the phase noise or the voltage controlled oscillator can be significantly improved.

10 Claims, 5 Drawing Sheets

CROSS-COUPLED VOLTAGE CONTROLLED OSCILLATOR WITH IMPROVED PHASE NOISE PERFORMANCE

BACKGROUND OF INVENTION

The present invention relates to integrated circuits used in radio frequency applications. Specifically, a fully integrated voltage controlled oscillator (VCO) is provided having reduced second harmonic content and improved phase noise performance.

Radiotelephone communications such as cellular telephone applications rely on analog circuits for generating various channel frequencies. The current design practices are to implement voltage controlled oscillators as part of a frequency synthesizer application to generate the various closely spaced signal channels for transmission and reception. These circuits typically rely upon a tuned circuit which has a digital frequency control to select a frequency band of operation, as well as a voltage tuned varactor to select a precise frequency within the selected band. Once the frequency, band is selected digitally, the oscillator operates as a voltage controlled oscillator by varying the voltage applied to the varactor.

A common circuit for providing a voltage controlled oscillator is described in "A Low Phase Noise Monolithic VCO in SiGe BiCMOS," 2000 *IEEE Radio Frequency Integrated Circuit Symposium*. These devices are implemented using cross-coupled bipolar transistors with a tuned circuit in the collectors of the cross-coupled transistors. The high phase noise level in the voltage controlled oscillator (VCO) embedded in the frequency synthesizer, is one of the major limitations to the full integration of transceivers for wireless application. One of the contributors to the phase noise are second harmonic signals which are generated by the current source which supplies currents to the emitter connections of the cross-coupled bipolar transistors. The second harmonic signals in turn generated mixing products in the tuned circuit of the VCO which is seen as phase noise in the output signal of the VCO. A net improvement in phase noise performance can therefore be obtained if second harmonic generation in the circuit can be suppressed.

SUMMARY OF THE INVENTION

It is an object of the present invention to provide a fully integrated voltage controlled oscillator having improved phase noise performance.

This and other objects of the invention are provided for by a cross-coupled differential bipolar transistor voltage controlled oscillator. The voltage controlled oscillator includes digital tuning means for selecting one of the plurality of frequency bands which are to be tuned by a pair of varactor diodes using an analog control voltage. A current source supplies an operating current to the transistors. Circuitry is provided for suppressing second harmonic signals generated by the current source which effectively eliminates one of the significant sources of phase noise in the circuit.

In one embodiment of the invention, a filter trap having a resonant frequency centered at the second harmonic signal frequency is placed across the current source to eliminate, or substantially reduce, the second harmonic signal amplitude. In accordance with a preferred embodiment of the invention, the tuned filter trap is a series resonant LC circuit having a center frequency set to be substantially within the frequency band of second harmonics generated by the voltage controlled oscillator. In a multiband application, traps having different. resonant frequencies, corresponding to the different second harmonic frequencies for different bands, may be digitally selected when a band of operation is selected.

DESCRIPTION OF THE PREFERRED EMBODIMENT

Figure 1:
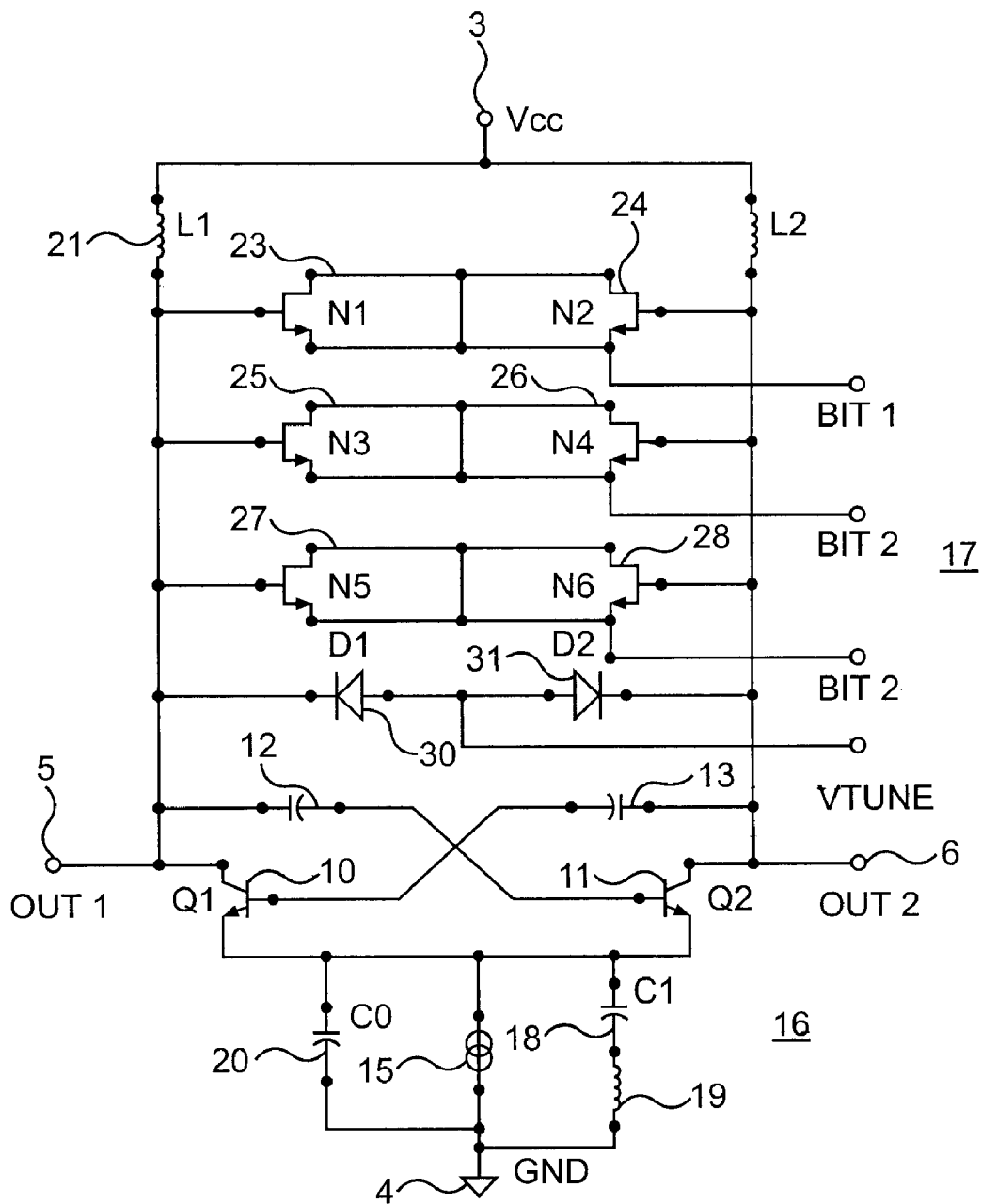
FIG. 1 illustrates a voltage controlled oscillator in accordance with a first embodiment of the invention.

Turning now to FIG. 1, there is shown a schematic drawing of a fully integrated voltage controlled oscillator. The circuit includes a cross-coupled differential voltage controlled oscillator including bipolar transistors 10 and 11. The transistors are crossed-coupled by capacitors 12 and 13 which interconnect the collector of one transistor to the base of the other. The circuit is powered from a d.c. power supply connected to terminals 3 and 4. A current source 15 supplies current to the cross-coupled bipolar transistors 10 and 11.

A parallel tuned circuit is connected across the collectors of transistors 10 and 11. The tuned circuit comprises a digitally tuned portion, as well as an analog tuned portion. The digitally tuned portion of the circuit selects bands of operation for the voltage controlled oscillator, and the varactor tuning selects the frequency of oscillation within each of the bands. FIG. 1 shows a three bit digital tuning circuit which receives data bits on input 17. The three pairs of MOSFETS 23 24, 25 26, and 27 28 provide a bank of capacitors. Each capacitor is formed by connecting the drain and source connections of each MOSFET together. The MOSFETS are used as a digitally tunable varactor. When the voltage between the terminals of the gate and the source/drain changed from Vcc to 0 (which is controlled by the voltage from the 3 bit of 17 on FIG. 1), the MOSFETS capacitance will change from high to low. Back-to-back varactor diodes 30 and 31 are also connected between collectors of the bipolar transistors 10 and 11. In operation, the digital tuning provided by the MOSFETS 23 24, 25 26, and 27 28 selects a band of operation, and the varactor diodes 30, 31 set the frequency within the band. The circuit is operated so that the VCO oscillator frequency is selected by the digital data appearing on input 17 and a control voltage is applied from a phase locked loop to the back-to-back varactor diodes 30, 31 to set the frequency of the oscillator. The output signal is produced on differential output terminals 5 and 6.

The circuit of FIG. 1 generates a second harmonic signal at the common emitter connections of bipolar transistors 10 and 11. In accordance with a first embodiment of the invention, a tuned filter trap 16 is connected across the current source 15 to reduce the amplitude of any second harmonic signal components which would normally be re-modulated into phase noise components by the a tuned circuit of the voltage controlled oscillator. The filter trap 16 is selected to have a center frequency within the mid range of the VCO oscillator second harmonic signal frequencies, and have a Q selected so that the trap will have a bandwidth which significantly reduces the amplitude of second harmonic signals generated over the band of frequencies over which the VCO oscillator operates.

The embodiment of FIG. 1 also includes a capacitor 20 connected in parallel with the tuned filter trap 16. Capacitor 20 is selected to roll off higher order harmonics which may appear at the common emitter connection of bipolar transistors 10 and 11, further reducing phase noise produced from higher order harmonics re-modulated into the a tuned circuit of the oscillator.

Suppressing the harmonic signals permits the circuit to operate with larger voltage swings at the collector without pushing transistors 10 and 11 into the reverse active operating region since there is less variation in emitter voltage.

Figure 2:
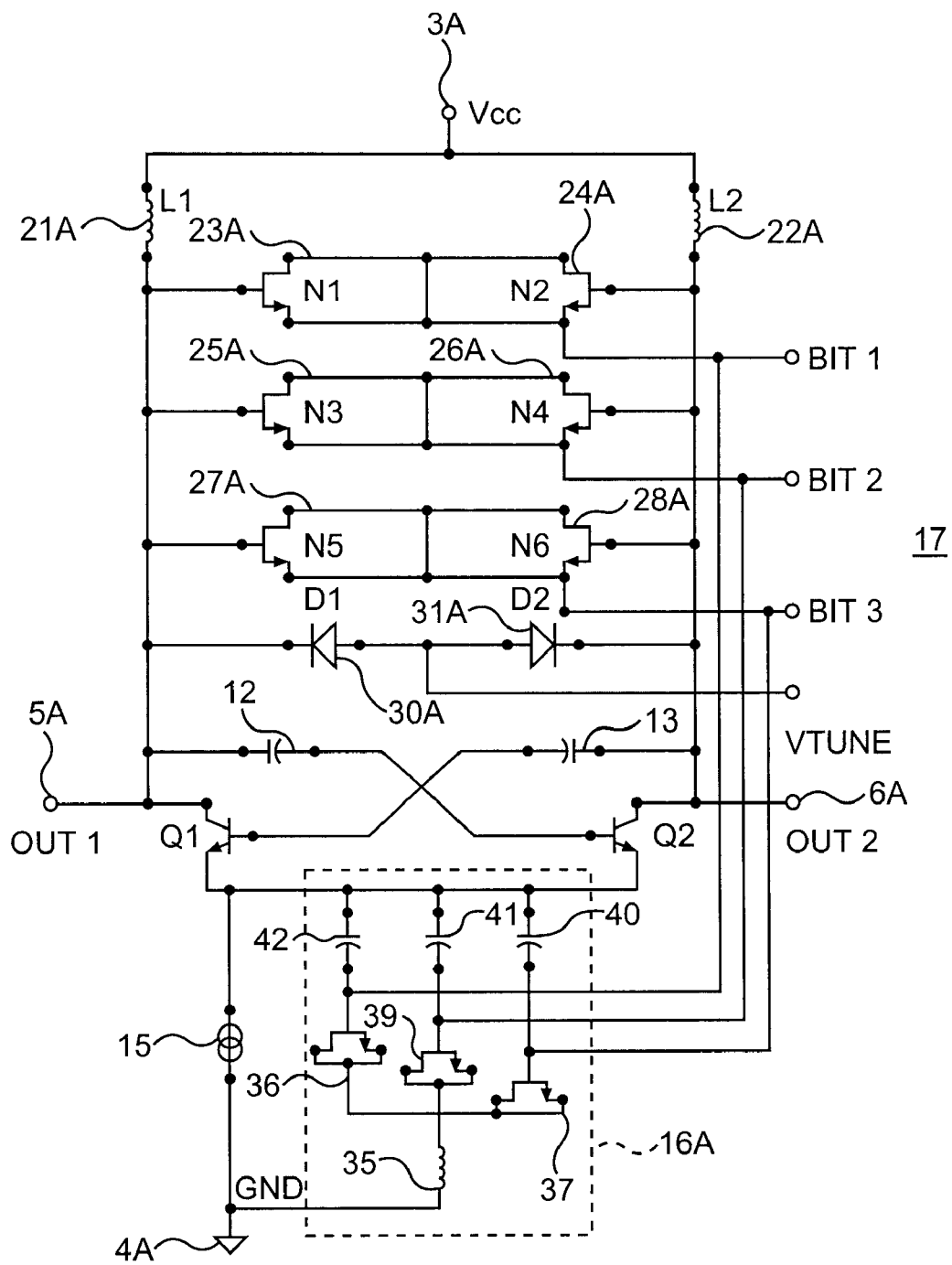
FIG. 2 illustrates a second embodiment of the invention in accordance with a preferred second embodiment of the invention.

FIG. 2 represents yet another embodiment of the invention which provides for second harmonic signal suppression when a single tuned series resonant circuit has insufficient bandwidth to cover the spectrum of the second harmonics generated by the voltage controlled oscillator. Circuit components which are identical to the circuit components of FIG. 1 are similarly numbered and include the letter A, and perform the same function as described with the foregoing description of FIG. 1. The circuit of FIG. 2 includes a multiple frequency filter trap 16A. The filter trap 16A has a common inductor 35 series. resonant with capacitors 36, 37 and 39 also formed from the gate capacitance of a single MOSFET having drain and source connections connected together. DC blocking capacitors 40, 41 and 42 isolate MOSFET transistors 36, 37 and 39 from any DC voltage appearing on the common emitter connections.

Each of the MOSFET transistors 36, 37, and 39 are controlled by the same coarse digital tuning information appearing on digital input 17A. A particular trap resonant frequency is therefore selected to correspond with the band of operation selected by the digital tuning circuit of the VCO oscillator. As in the previous embodiment, the Q for each series resonant trap may be selected to provide a bandwidth to effectively trap any second harmonic signal generated by the selected frequency bands. Differential output signals for the circuit are provided on terminals 5A and 6A.

Figure 3:
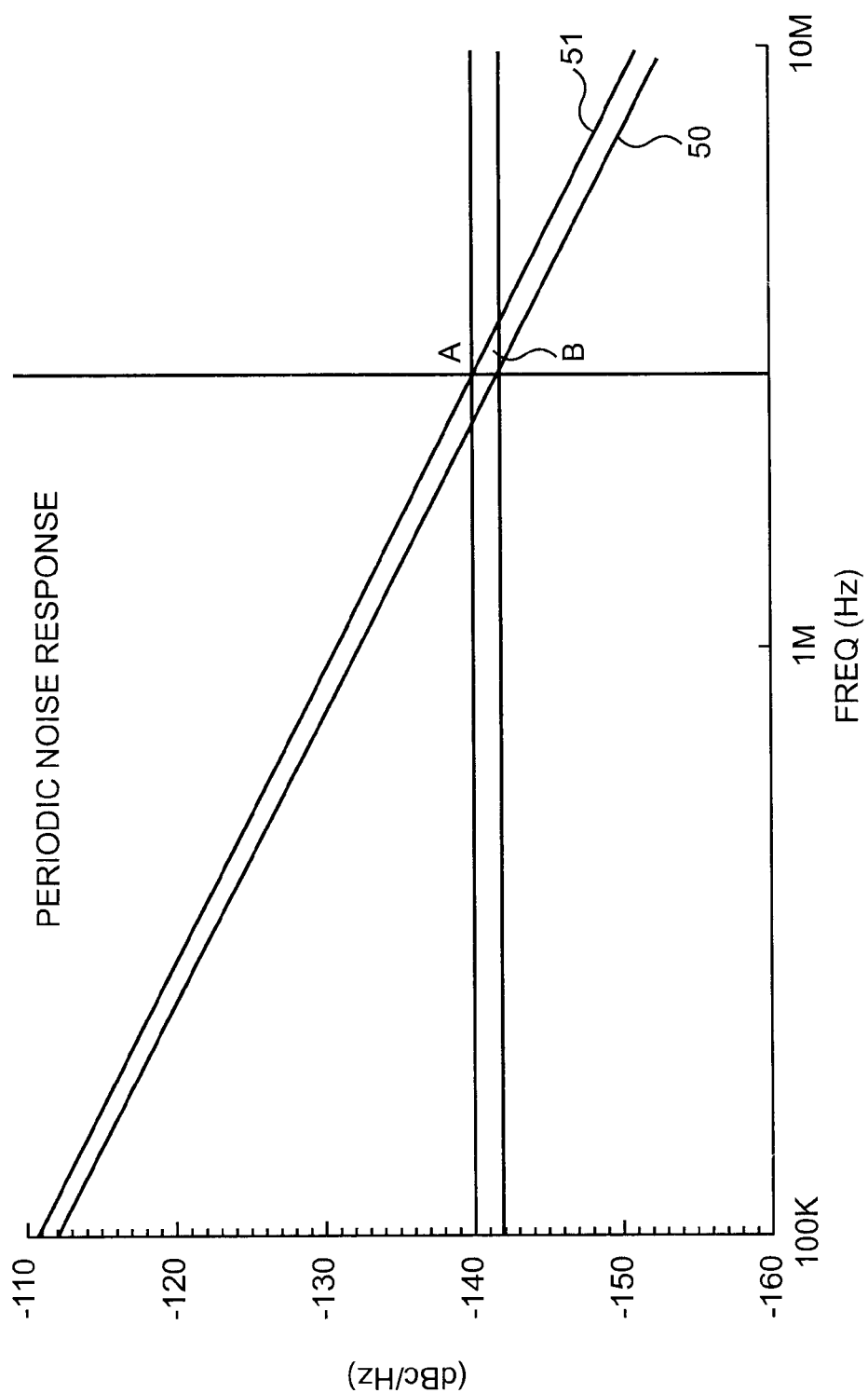
FIG. 3 illustrates the relative phase noise performance of the preferred embodiment having a second harmonic filter trap verses the prior art circuit with no filter trap.

Turning now to FIG. 3, there is shown the relative improvement in performance obtained using the tuned filtered trap. The oscillator circuit of FIG. 1 was designed and operated at 900 MHZ. The phase noise vs frequency for the VCO output signal is shown in FIG. 3 as 50 for the circuit with a second harmonic filter trap, and as 51 for a prior art VCO oscillator without a second harmonic trap. As shown in FIG. 3, for an offset of 3 MHZ from the oscillation frequency, the phase noise 50 is 1.9 dB lower than the phase noise 51 produced without the trap.

Figure 4:
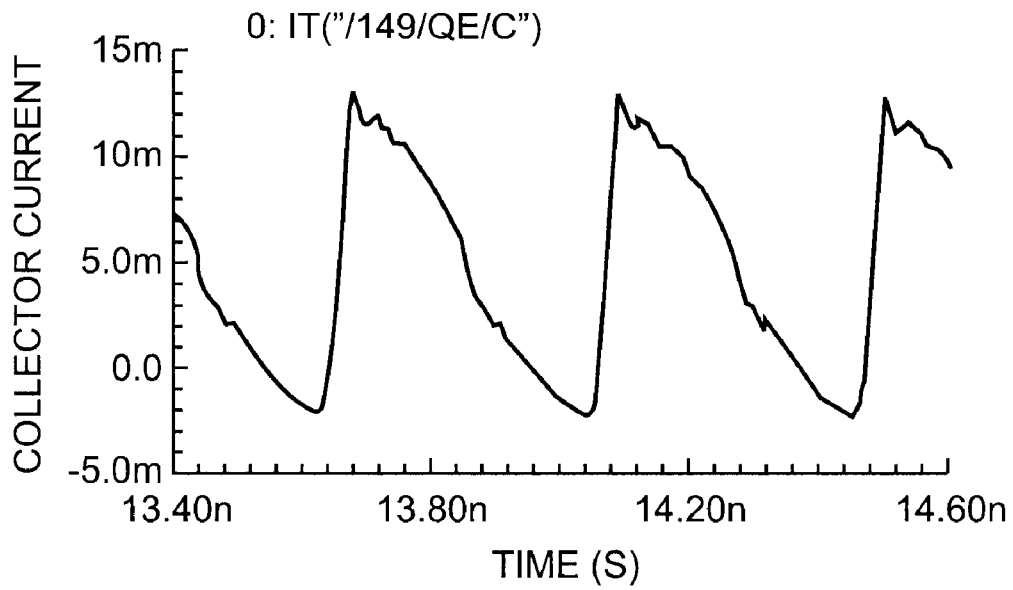
FIG. 4 shows the current through the VCO bipolar transistors without the harmonic filter trap.
Figure 5:
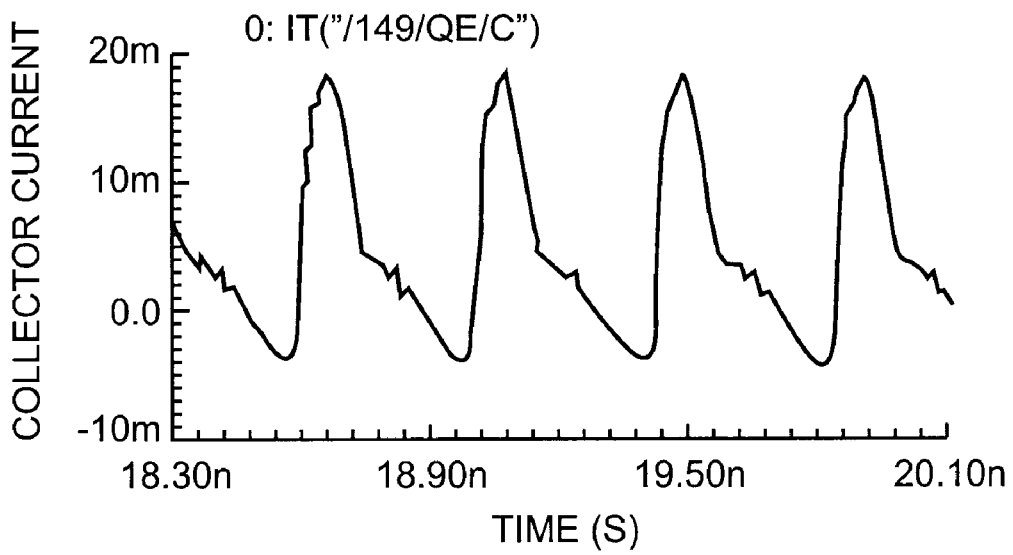
FIG. 5 shows the current through the VCO bipolar transistors with a harmonic filter trap.

FIGS. 4 and 5 show additional benefits of the circuit which uses a second harmonic trap. The current through bipolar transistors of a prior art VCO having no second harmonic trap are shown in FIG. 4, and the current through the bipolar transistors 10, 11 of FIG. 1 with the trap is shown in FIG. 5. The trap provides a sharper current waveform for the transistors which introduces less average shot noise into the VCO oscillator over the same time period.

Figure 6:
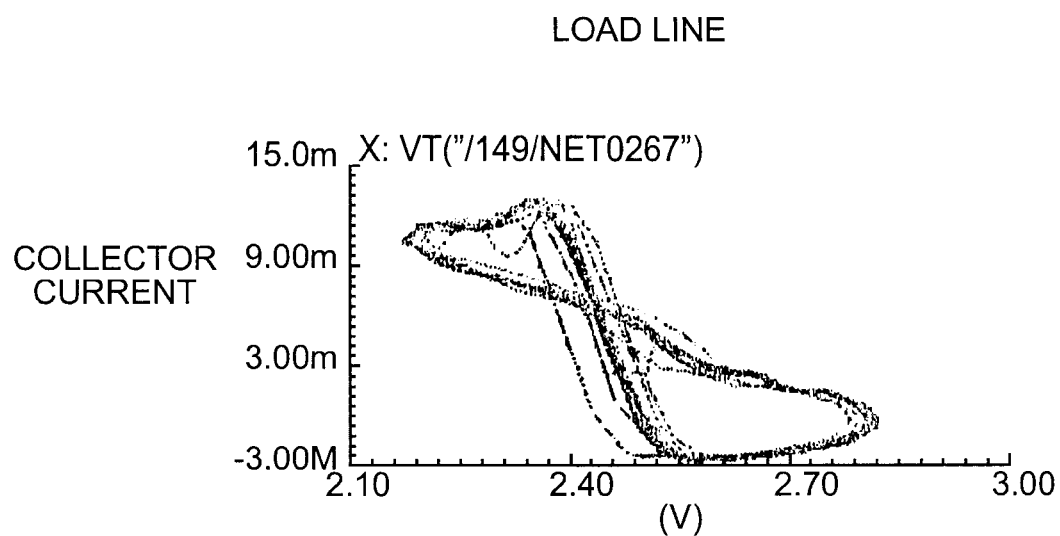
FIG. 6 shows the load line of the VCO bipolar transistors without a harmonic filter trap.
Figure 7:
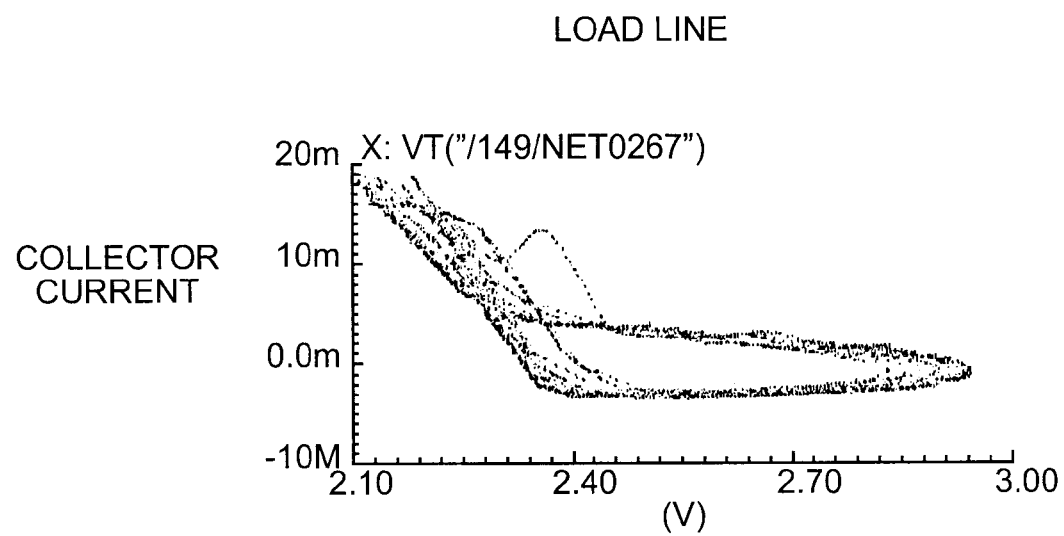
FIG. 7 shows the load line of the VCO bipolar transistors with a harmonic filter trap.

Another advantage of the VCO oscillator having a filter trap for suppressing the second harmonic components can be seen by observing the load lines of the bipolar transistors 10, 11 in FIGS. 6 and 7. The load line 60 for the circuit of FIG. 1. with the filter trap are more constant than the load line for a prior art VCO oscillator without the trap 61, resulting in a more linear operation of bipolar transistors 10, 11 lowering the phase noise as well as shot noise.

The foregoing description of the invention illustrates and describes the present invention. Additionally, the disclosure shows and describes only the preferred embodiments of the invention in the context of a voltage controlled oscillator, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

What is claimed is:

1. A voltage controlled oscillator having reduced phase noise comprising:

a pair of bipolar transistors having common emitter connections, and having base connections capacitively cross coupled to collectors of each other transistor;

a tuning circuit having a resonant frequency comprising first and second varactor diodes connected between said collectors; digital capacitor means connected in parallel with said varactor diodes; first and second inductors serially connected to said collectors and a first terminal of a voltage supply;

a current source connected serially with said emitter connections and a second terminal of said voltage supply; and a tuned filter trap connected to said emitter connections and to said second terminal, said filter trap having a frequency response for suppressing second harmonic signals of said resonant frequency.

2. The voltage controlled oscillator of claim 1 wherein said tuned filter trap comprises an inductor serially connected to a capacitor forming a series resonant circuit.

3. The voltage controlled oscillator of claim 1 wherein said tuned filter trap comprises:

a series inductor;

a plurality of MOSFETS serially connected to said inductor;

a plurality of capacitors connected in series with said MOSFETS and said emitter connections, said MOSFETS controlling the frequency of said tuned filter trap.

4. The voltage controlled oscillator of claim 3 wherein said MOSFETS have gate connections connected to said digital capacitor means wherein the tuned filter trap frequency is changed with the changing of said resonant frequency.

5. The voltage controlled oscillator of claim 3 wherein said MOSFETS have commonly connected drains and sources serially connected to said series inductor, and gate connections connected to said capacitors.

6. The voltage controlled oscillator of claim 4 wherein said digital capacitor means has a 3 bit input for selecting a coarse frequency of operation for said oscillator.

7. The voltage controlled oscillator of claim 6 wherein said MOSFETS have gate connections connected to said digital capacitor means input.

8. The voltage controlled oscillator of claim 1 further comprising first and second output connections connected to respective of said collectors to form differential output signals for said oscillator.

9. The voltage controlled oscillator according to claim 1 further comprising a filtering component connected in parallel with said tuned filter trap for reducing the amplitude of higher order harmonic signals.

10. The voltage controlled oscillator according to claim 9 wherein said filtering component is a capacitor.

* * * * *